US011119539B2

(12) United States Patent
Lee et al.

(10) Patent No.: US 11,119,539 B2
(45) Date of Patent: Sep. 14, 2021

(54) DISPLAY

(71) Applicant: Au Optronics Corporation, Hsinchu (TW)

(72) Inventors: Chih-Tsung Lee, Hsinchu (TW); Zih-Shuo Huang, Hsinchu (TW); Kun-Lung Hsieh, Hsinchu (TW); Kai-Yu Yu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/924,233

(22) Filed: Jul. 9, 2020

(65) Prior Publication Data

US 2021/0026412 A1    Jan. 28, 2021

Related U.S. Application Data

(60) Provisional application No. 62/877,883, filed on Jul. 24, 2019.

(30) Foreign Application Priority Data

Mar. 23, 2020 (TW) .................................. 109109569

(51) Int. Cl.
*H05K 1/02* (2006.01)
*G06F 1/16* (2006.01)
*H05K 1/18* (2006.01)

(52) U.S. Cl.
CPC ........... *G06F 1/1652* (2013.01); *H05K 1/028* (2013.01); *H05K 1/189* (2013.01); *H05K 2201/10128* (2013.01)

(58) Field of Classification Search
CPC ................... H05K 1/028; H05K 1/189; H05K 2201/10128; G06F 1/1652; G09F 9/301
(Continued)

(56) References Cited

U.S. PATENT DOCUMENTS 8,740,447 B2   6/2014   Kao et al.
9,983,424 B2   5/2018   Kim et al.
(Continued)

FOREIGN PATENT DOCUMENTS

CN    106252378    12/2016
CN    208141720    11/2018
(Continued)

*Primary Examiner* — Sherman Ng
(74) *Attorney, Agent, or Firm* — JCIPRNET

(57) ABSTRACT

A display, including a supporting layer and a flexible display panel, is provided. The supporting layer has at least two extending sections and at least one bending section, connected therebetween and adapted to be bent along an axis as a rotation axis. The supporting layer has at least one groove at the bending section and at least one indentation at a bottom surface of the groove. An extending direction of the groove is parallel to the axis. An extending direction of the indentation is not parallel to the axis. The supporting layer has a first thickness at each extending section, a second thickness at the groove, and a third thickness at the indentation. The first, second, and third thicknesses are different from one another. The flexible display is disposed on the supporting layer. The groove and the flexible display are respectively located on two opposite sides of the supporting layer.

10 Claims, 9 Drawing Sheets

(58) Field of Classification Search
USPC .......................................................... 361/749
See application file for complete search history.

(56) References Cited

U.S. PATENT DOCUMENTS

| | | | |
|---|---|---|---|
| 2012/0250289 | A1 | 10/2012 | Kao et al. |
| 2014/0226275 | A1 | 8/2014 | Ko et al. |
| 2015/0313004 | A1* | 10/2015 | Namkung ............... G09F 9/301 361/749 |
| 2016/0195901 | A1* | 7/2016 | Kauhaniemi ......... G06F 1/1681 361/679.27 |
| 2016/0357052 | A1 | 12/2016 | Kim et al. |
| 2018/0011514 | A1* | 1/2018 | Yoo ....................... G06F 1/1626 |
| 2020/0013970 | A1* | 1/2020 | Wang ................. H01L 51/0097 |

FOREIGN PATENT DOCUMENTS

| | | |
|---|---|---|
| TW | 201242357 | 10/2012 |
| TW | M521194 | 5/2016 |
| TW | 201944218 | 11/2019 |

* cited by examiner

DISPLAY

CROSS-REFERENCE TO RELATED APPLICATION

This application claims the priority benefits of U.S. provisional application Ser. No. 62/877,883, filed on Jul. 24, 2019, and Taiwan application serial no. 109109569, filed on Mar. 23, 2020. The entirety of each of the above-mentioned patent applications is hereby incorporated by reference herein and made a part of this specification.

BACKGROUND

Technical Field

The disclosure relates to a display, and particularly to a display including a flexible display panel.

Description of Related Art

With the development of display panel processing, the technology of manufacturing flexible display panels has gradually matured, enabling the flexible display panels to popularize among consumer products. The flexible display panels may be applied to foldable electronic devices, such as foldable handphones and tablet computers. The flexible display panels are simultaneously disposed on the two bodies of the electronic device and may be flexed along with the opening and closing of the two bodies. In the foldable electronic devices, the flexible display panel is generally attached to one side of a flexible stainless-steel sheet, and a supporting structure is disposed on the other side of the stainless-steel sheet. The stainless-steel sheet and the supporting structure jointly constitute the supporting layer, so as to support the flexible display panel and to connect to the housing.

In order for the flexible display panel and the stainless-steel sheet to be smoothly flexed, the supporting structure is disposed only on a partial section (non-bending section) of the stainless-steel sheet to produce a step at where the supporting structure is not disposed, so as to define a bending section with less overall thickness. Under such configuration, the stainless-steel sheet is not supported by the supporting structure at the bending section, so that the flexible display panel and the stainless-steel sheet may be easily recessed at the bending section, and may be easily distorted and damaged along with the bending of the overall device due to relatively insufficient structural strength of the bending section. In addition, there is the step at the junction between the supporting structure and the bending section of the stainless-steel sheet, which may easily cause stress concentration, thereby further increasing the probability of structural damage. Furthermore, the stainless-steel sheet may contain impurity that affect the material property thereof, which results in cracking after multiple times of bending.

SUMMARY

The disclosure provides a display, having better structural strength and can prevent a flexible display panel from recessing at a bending section.

The display of the disclosure includes a supporting layer and a flexible display panel. The supporting layer has at least two extending sections and at least one bending section. The bending section is connected between the extending sections and is adapted to be bent along an axis as a rotation axis. The supporting layer has at least one groove at the bending section and at least one indentation on a bottom surface of the groove. An extending direction of the groove is parallel to the axis. An extending direction of the indentation is not parallel to the axis. The supporting layer has a first thickness at each extending section. The supporting layer has a second thickness at the groove. The supporting layer has a third thickness at the indentation. The first thickness, the second thickness, and the third thickness are different from one another. The flexible display panel is disposed on the supporting layer. The groove and the flexible display panel are respectively located on two opposite sides of the supporting layer.

In an embodiment of the disclosure, the supporting layer has at least one supporting convex portion at the bending section to define the groove.

In an embodiment of the disclosure, the display includes a carrying main body, wherein the supporting layer is carried on the carrying main body, and the supporting convex portion is supported between the bending section and the carrying main body to form an accommodating space between the bending section and the carrying main body.

In an embodiment of the disclosure, the display includes a carrying main body, wherein the supporting layer has at least one guiding groove on a top surface of the supporting convex portion, an extending direction of the guiding groove is perpendicular to the axis, and the supporting layer is adapted to slide relative to the carrying main body by guidance of the guiding groove.

In an embodiment of the disclosure, a top surface of the supporting convex portion is a concave-convex surface.

In an embodiment of the disclosure, a junction between the groove and the supporting convex portion forms a chamfered corner or a rounded corner.

In an embodiment of the disclosure, the device includes a carrying main body, wherein the supporting layer has at least one guiding groove at at least one extending section, the guiding groove and the flexible display panel are respectively located on two opposite sides of the supporting layer, an extending direction of the guiding groove is perpendicular to the axis, and the supporting layer is adapted to slide relative to the carrying main body by guidance of the guiding groove.

In an embodiment of the disclosure, the device includes at least one flexible circuit board, wherein the flexible circuit board has at least one electronic element thereon, the supporting layer has at least one groove at at least one extending section, the groove and the flexible display panel are respectively located on two opposite sides of the supporting layer, the flexible circuit board is connected to the flexible display panel and is bent toward the groove, and the electronic element is accommodated in the groove.

In an embodiment of the disclosure, a surface of the extending section is a concave-convex surface.

In an embodiment of the disclosure, a junction between the groove and the extending section forms a chamfered corner or a rounded corner.

Based on the above, the supporting layer of the disclosure forms the groove at the bending section thereof to reduce the thickness of the supporting layer at the groove, and the extending direction of the groove is parallel to the bent axis of the bending section, so that the supporting layer may be easily bent. In the bending section, the portion where the groove is not formed (i.e. the supporting convex portion) may partially maintain the structural strength of the bending section to prevent the flexible display panel from recessing at the bending section due to insufficient overall structural strength of the bending section. In addition, the supporting layer of the disclosure further forms the indentation at the bottom surface of the groove, and the extending direction of the indentation is not parallel to the bent axis of the bending section to provide the effect similar to a structural reinforcement rib when bending the bending section, so that the supporting layer and the flexible display panel are less likely to be distorted and damaged due to bending. Moreover, as mentioned above, forming the indentation at the bottom surface of the groove achieves the effect of appropriately removing the material of the supporting layer to reduce the impurity content in the material of the supporting layer, thereby preventing the impurity from affecting the material property of the supporting layer and causing cracking after multiple times of bending. Furthermore, instead of defining the bending section by combining components of different materials, the supporting layer of the disclosure defines the bending section by forming the groove as mentioned above, so the supporting layer of the disclosure may be an integrally formed structure to facilitate the formation of the chamfered corner or the rounded corner at the step of the bending section, so as to prevent stress concentration at the step of the bending section, which increases the probability of structural damage. In addition, the chamfered corner or the rounded corner can reduce the step level between the bending section and the extending section, and also has the effect of preventing the flexible display panel from recessing at the bending section.

To make the aforementioned and other features of the disclosure more comprehensible, several embodiments accompanied with drawings are described in detail as follows.

DETAILED DESCRIPTION OF DISCLOSED EMBODIMENTS

Figure 1:
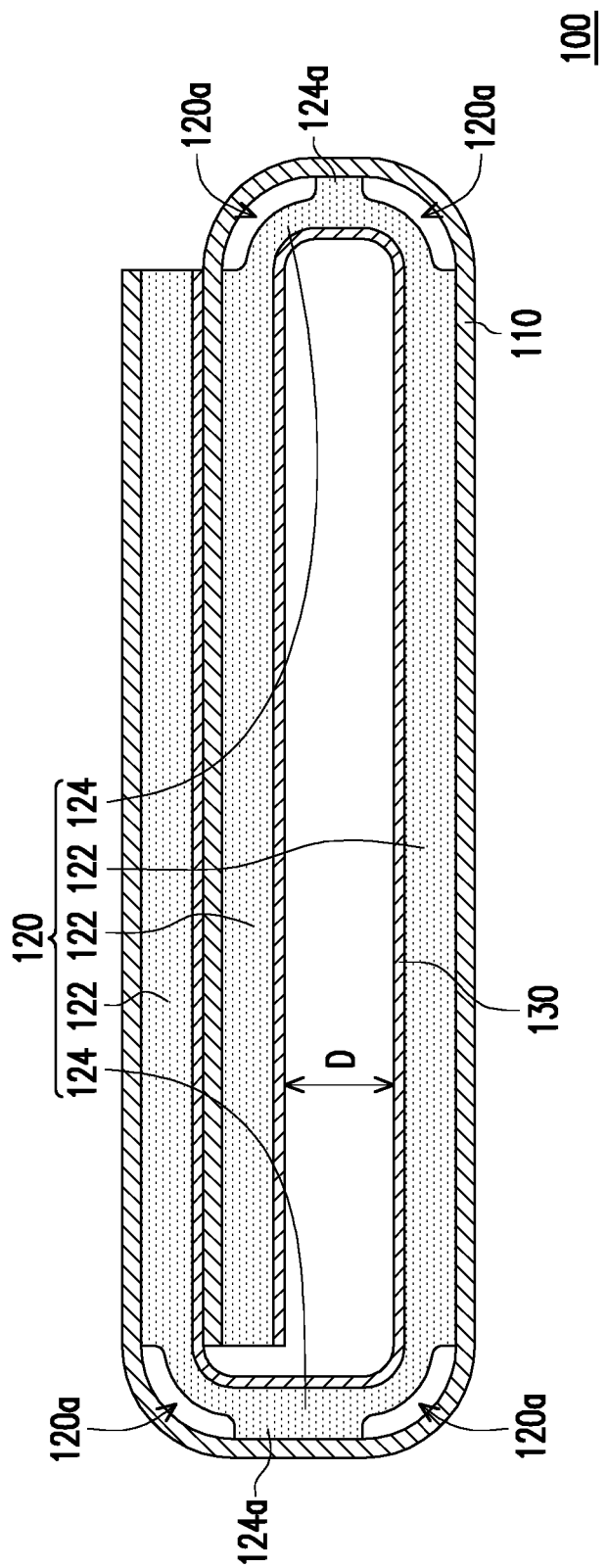
FIG. 1 is a cross-sectional schematic view of a display according to an embodiment of the disclosure.
Figure 2:
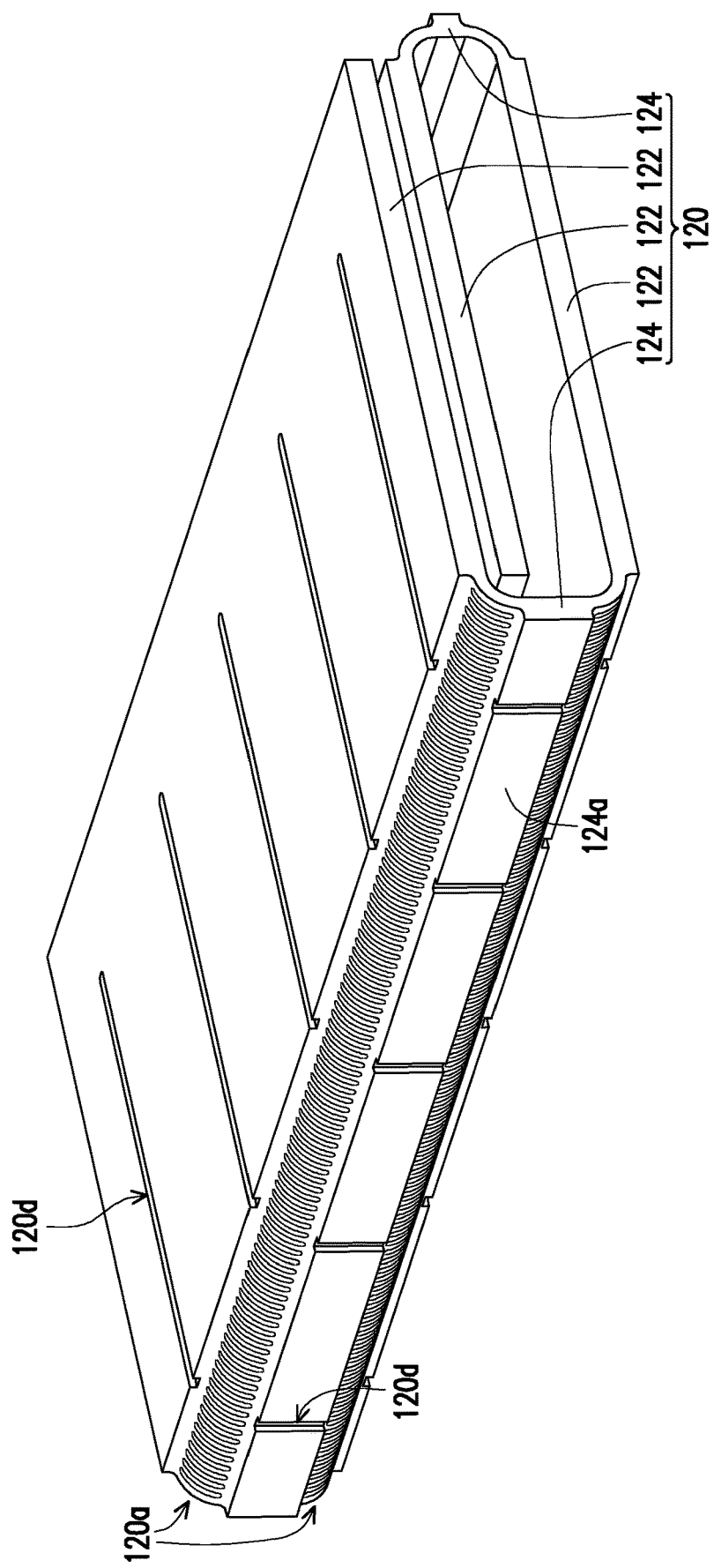
FIG. 2 is a perspective view of a supporting layer of FIG. 1.
Figure 3:
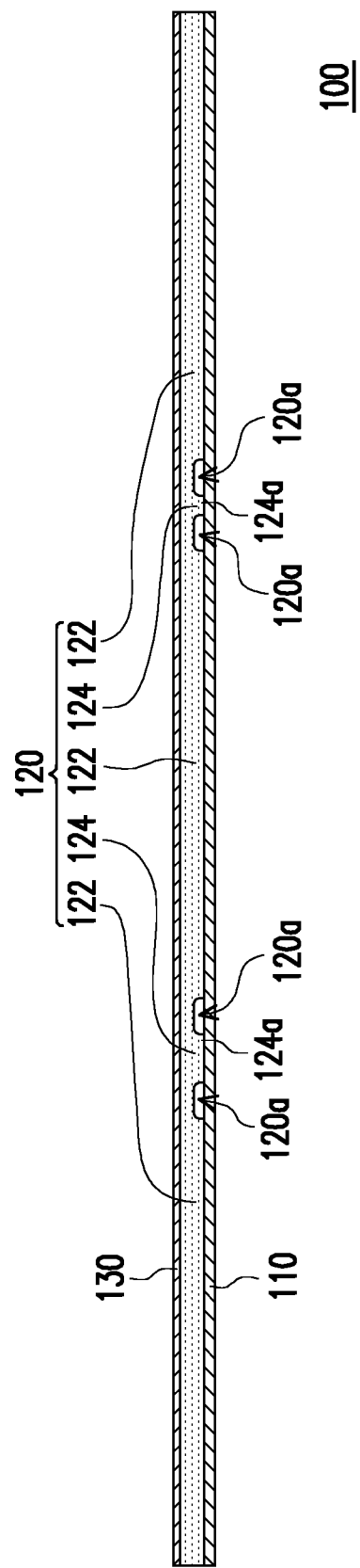
FIG. 3 illustrates the opening of the display of FIG. 1.

FIG. 1 is a cross-sectional schematic view of a display according to an embodiment of the disclosure. FIG. 2 is a perspective view of a supporting layer of FIG. 1. FIG. 3 illustrates the opening of the display of FIG. 1. Please refer to FIG. 1 to FIG. 3. A display 100 of the embodiment is, for example, a foldable smartphone, and includes a carrying main body 110, a supporting layer 120, and a flexible display panel 130. The flexible display panel 130 is disposed on the supporting layer 120. The flexible display panel 130 and the supporting layer 120 are jointly carried on the carrying main body 110. The display 100 may be kept to the state shown in FIG. 1 to facilitate storage or carrying, and may be expanded to the state shown in FIG. 3, so that the user may conveniently operate the display 100 and view the image displayed by the flexible display panel 130.

In detail, the supporting layer 120 has at least two extending sections 122 (illustrated as three) and at least one bending section 124 (illustrated as two). Each bending section 124 is connected between two extending sections 122 and is adapted to be bent, so that the display 100 becomes the state shown in FIG. 1 or the state shown in FIG. 3. In the embodiment, the material of the supporting layer 120 is, for example, stainless-steel, and the material of the carrying main body 110 is, for example, plastic or metal, but the disclosure is not limited thereto. In addition, the carrying main body 110 shown in FIG. 1 and FIG. 3 is only illustrative, the carrying main body 110 may actually be a flexible housing and adapted to be bent between the state shown in FIG. 1 and the state shown in FIG. 2, or may be multiple housings pivotally connected to each other by a hinge and adapted to be bent between the state shown in FIG. 1 and the state shown in FIG. 2, and the disclosure is not limited thereto.

Figure 4:
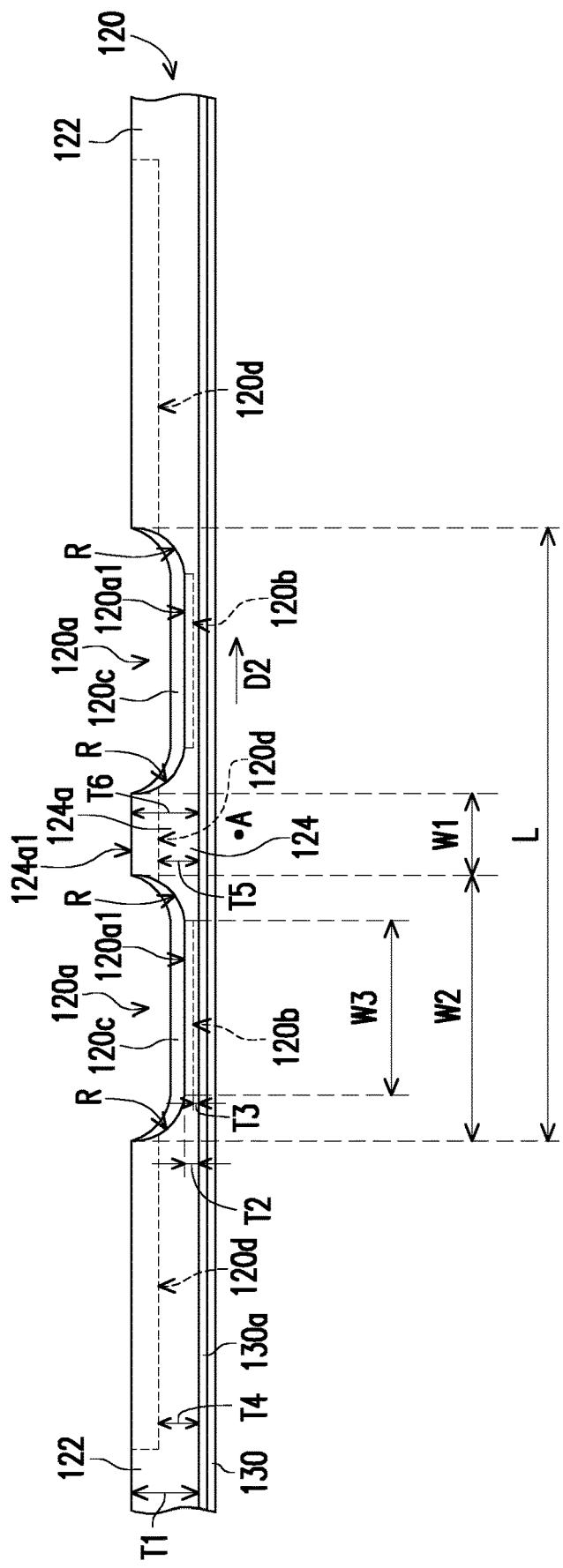
FIG. 4 is a partial enlarged view of a supporting layer and a flexible display panel of FIG. 3.
Figure 5:
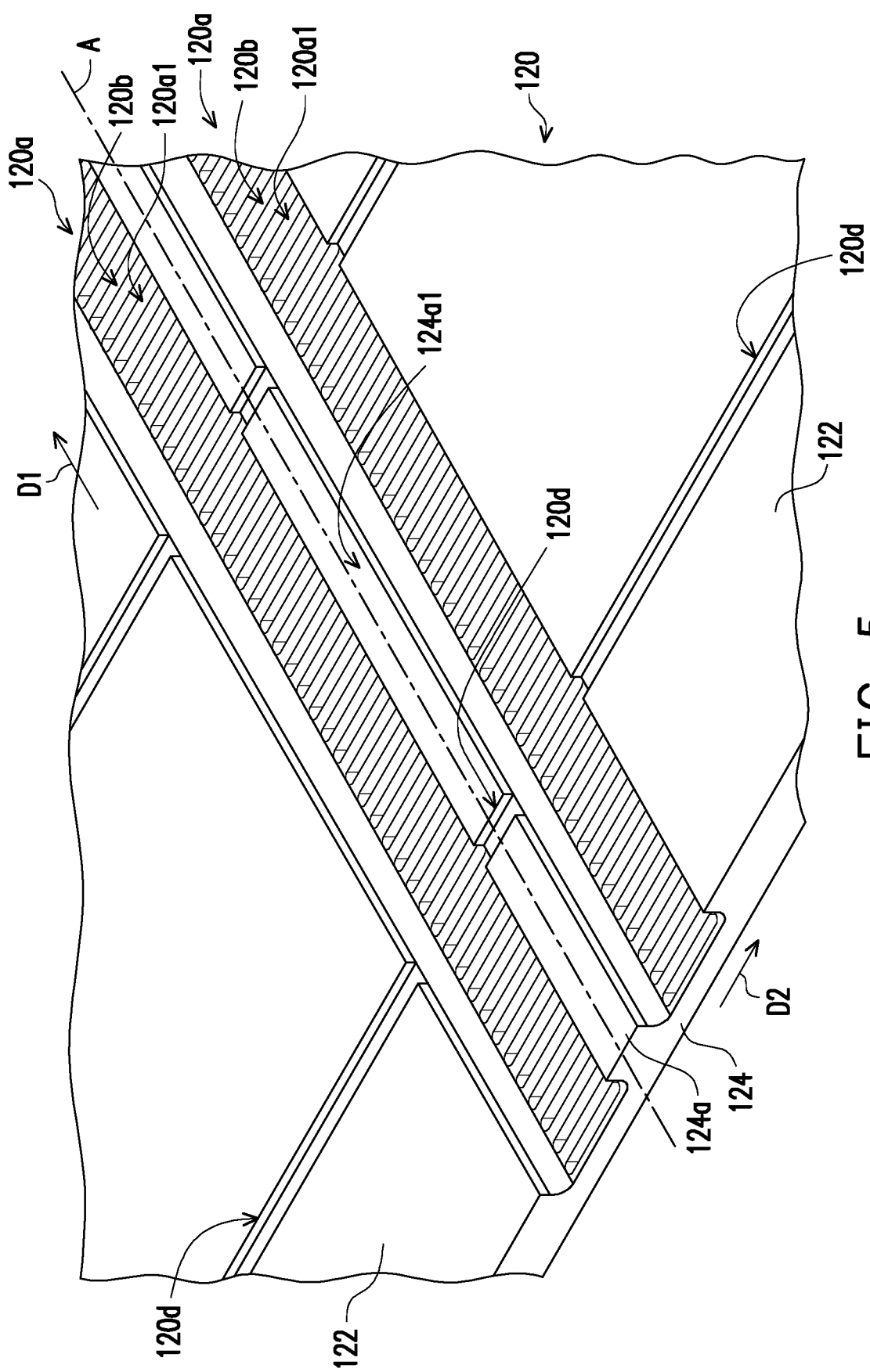
FIG. 5 is a perspective view of the supporting layer of FIG. 4.

FIG. 4 is a partial enlarged view of a supporting layer and a flexible display panel of FIG. 3. FIG. 5 is a perspective view of the supporting layer of FIG. 4. Please refer to FIG. 4 and FIG. 5. The bending section 124 of the supporting layer 120 is adapted to be bent along an axis A as a rotation axis. The supporting layer 120 has at least one supporting convex portion 124a (illustrated as one) at the bending section 124 to define at least one groove 120a (illustrated as two). The groove 120a and the flexible display panel 130 are respectively located at two opposite sides of the supporting layer 120. An extending direction D1 (labeled in FIG. 5) of each groove 120a is parallel to the axis A. Further, a bottom surface 120a1 of the supporting layer 120 at each groove 120a has at least one indentation 120b (illustrated as multiple). An extending direction D2 of each indentation 120b (labeled in FIG. 5) is perpendicular to the axis A. In other embodiments, the extending direction of each indentation 120b may be not perpendicular and not parallel to the axis A, which is not limited by the disclosure.

As shown in FIG. 4, the supporting layer 120 has a first thickness T1 at each extending section 122. Moreover, by the configuration of the groove 120a and the indentation 120b, the supporting layer 120 has a second thickness T2 at the groove 120a and a third thickness T3 at the indentation 120b. The first thickness T1, the second thickness T2, and the third thickness T3 are different from one another. Specifically, the first thickness T1 is greater than the second thickness T2, and the second thickness T2 is greater than the third thickness T3. In the embodiment, the groove 120a and the indentation 120b may be formed at the bending section 124 of the supporting layer 120 by milling, etching, laser processing, extrusion molding, or other suitable ways, which is not limited by the disclosure.

As mentioned above, the groove 120a is formed at the bending section 124 to reduce the thickness of the supporting layer 120 at the groove 120a, and the extending direction of the groove 120a is parallel to the bent axis A of the bending section 124, so that the supporting layer 120 may be easily bent. In the bending section 124, the portion where the groove 120a is not formed (i.e. the supporting convex portion 124a) may partially maintain the structural strength of the bending section 124 to prevent the flexible display panel 130 from easily recessing at the bending section 124 due to insufficient overall structural strength of the bending section 124. In addition, as mentioned above, the indentation 120b is further formed at the bottom surface 120a1 of the groove 120a, and the extending direction D2 of the indentation 120b is not parallel to the bent axis A of the bending section 124 to provide the effect similar to a structural reinforcement rib when bending the bending section 124, so that the supporting layer 120 and the flexible display panel 130 are less likely to be distorted and damaged due to bending.

Further, the supporting convex portion 124a is supported between the bending section 124 and the carrying main body 110 as shown in FIG. 1. An accommodating space (i.e. space defined by the groove 120a) is formed between the bending section 124 and the carrying main body 110. The accommodating space may accommodate particles such as dust that enter between the bending section 124 and the carrying main body 110 from the outside to prevent particles such as dust from closely leaning against the supporting layer 120 and causing the flexible display panel 130 to exhibit bumps. Moreover, as mentioned above, forming the indentation 120b at the bottom surface 120a1 of the groove 120a achieves the effect of appropriately removing the material of the supporting layer 120 to reduce the impurity content in the material of the supporting layer 120, thereby preventing the impurity from affecting the material property of the supporting layer 120 and causing cracking after multiple times of bending.

Furthermore, since instead of defining the bending section by combining components of different materials, the supporting layer 120 defines the bending section 124 by forming the groove 120a as mentioned above, the supporting layer 120 may be an integrally formed structure to facilitate the formation of a chamfered corner or a rounded corner at a step of the bending section 124, so as to prevent stress concentration at the step of the bending section 124, which increases the probability of structural damage. In addition, the chamfered corner or the rounded corner can reduce the step level between the bending section 124 and the extending section 122, and also has the effect of preventing the flexible display panel 130 from recessing at the bending section 124. Specifically, a rounded corner R may be formed at the junction between the groove 120a and the supporting convex portion 124a as shown in FIG. 4, and a rounded corner R may be formed at the junction between the groove 120a and the extending section 122 as shown in FIG. 4.

The flexible display panel 130 of the embodiment is adhered to the supporting layer 120 by, for example, an adhesive layer 130a as shown in FIG. 4. Further, a structural reinforcement layer 120c may be formed in the groove 120a by ways such as adhesive coating or electroplating to enhance the resilience of the supporting layer 120 and prevent cracking.

Please refer to FIG. 4 and FIG. 5. In the embodiment, the supporting layer 120 respectively has multiple guiding grooves 120d on a top surface 124a1 of the supporting convex portion 124a and on the extending section 122. The extending direction D2 of the guiding groove 120d is perpendicular to the axis A. The guiding groove 120d and the flexible display panel 130 are respectively located on two opposite sides of the supporting layer 120. The supporting layer 120 is adapted to slide relative to the carrying main body 110 (illustrated in FIG. 1 and FIG. 3) by guidance of the guiding groove 120d. Specifically, the side of the carrying main body 110 facing the supporting layer 120 may have a guiding convex portion corresponding to the guiding groove 120d, so that the carrying main body 110 and the supporting layer 120 may be slidably disposed with each other by cooperation of the guiding groove 120d and the guiding convex portion. In other embodiments, the carrying main body 110 and the supporting layer 120 may be slidably disposed with each other by other suitable structures, which is not limited by the disclosure.

By the configuration of the guiding groove 120d, the supporting layer 120 has a fourth thickness T4 at the guiding groove 120d of the extending section 122 and a fifth thickness T5 at the guiding groove 120d of the supporting convex portion 124a. The fourth thickness T4 and the fifth thickness T5 are different from the first thickness T1, the second thickness T2, and the third thickness T3. Specifically, the first thickness T1 is greater than the fourth thickness T4 and the fifth thickness T5, the fourth thickness T4 and the fifth thickness T5 are greater than the second thickness T2 and the third thickness T3, and the fourth thickness T4 and the fifth thickness T5 may be the same or different. In the embodiment, the guiding groove 120d may be formed at the extending section 122 and the supporting convex portion 124a of the supporting layer 120 by milling, etching, laser processing, extrusion molding, or other suitable ways, which is not limited by the disclosure.

More specifically, in the embodiment, the second thickness T2 is, for example, between 10 microns and 100 microns, the first thickness T1 is, for example, between 2 times the second thickness T2 and 100 times the second thickness T2, a sixth thickness T6 of the supporting layer 120 at the supporting convex portion 124a is, for example, less than or equal to the first thickness T1 and greater than the second thickness T2, and the third thickness T3 is, for example, between 0.1 times the second thickness T2 and 0.9 times the second thickness T2. For example, the first thickness T1 may be 450 microns, the sixth thickness T6 may be 100 microns, the second thickness T2 may be 40 microns, and the third thickness may be 20 microns. In addition, the radius of curvature of the rounded corner R may be 410 microns.

In addition, if the distance between the two extending sections 122 is defined as D (labelled in FIG. 1) in the bent state of the supporting layer 120, and the distance between the two extending sections 122 is defined as L (labelled in FIG. 4) in the expanded state of the supporting layer 120, a width w1 of the supporting convex portion 124a is, for example, between 0.05 times the distance D and 0.45 times the distance D. For example, the distance D may be 5 mm, the width w1 of the supporting convex portion 124a may be 1 mm, and the distance L may be 7.854 mm. Correspondingly, a width w2 of each groove 120a may be 3.247 mm. In addition, a width w3 of the indentation 120d may be between 2 mm and 3.247 mm.

Figure 6:
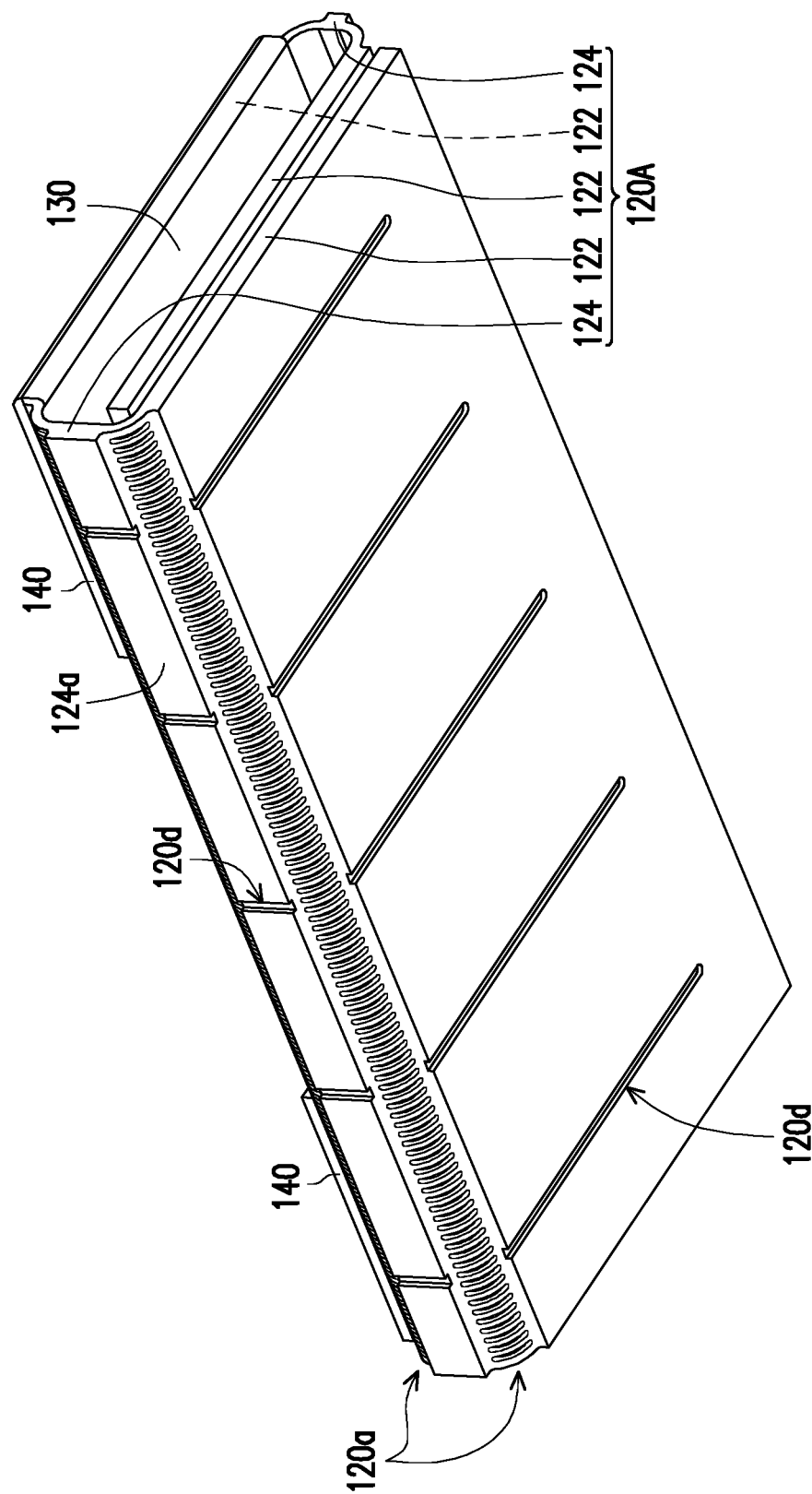
FIG. 6 is a perspective view of some components of a display according to another embodiment of the disclosure.
Figure 7:
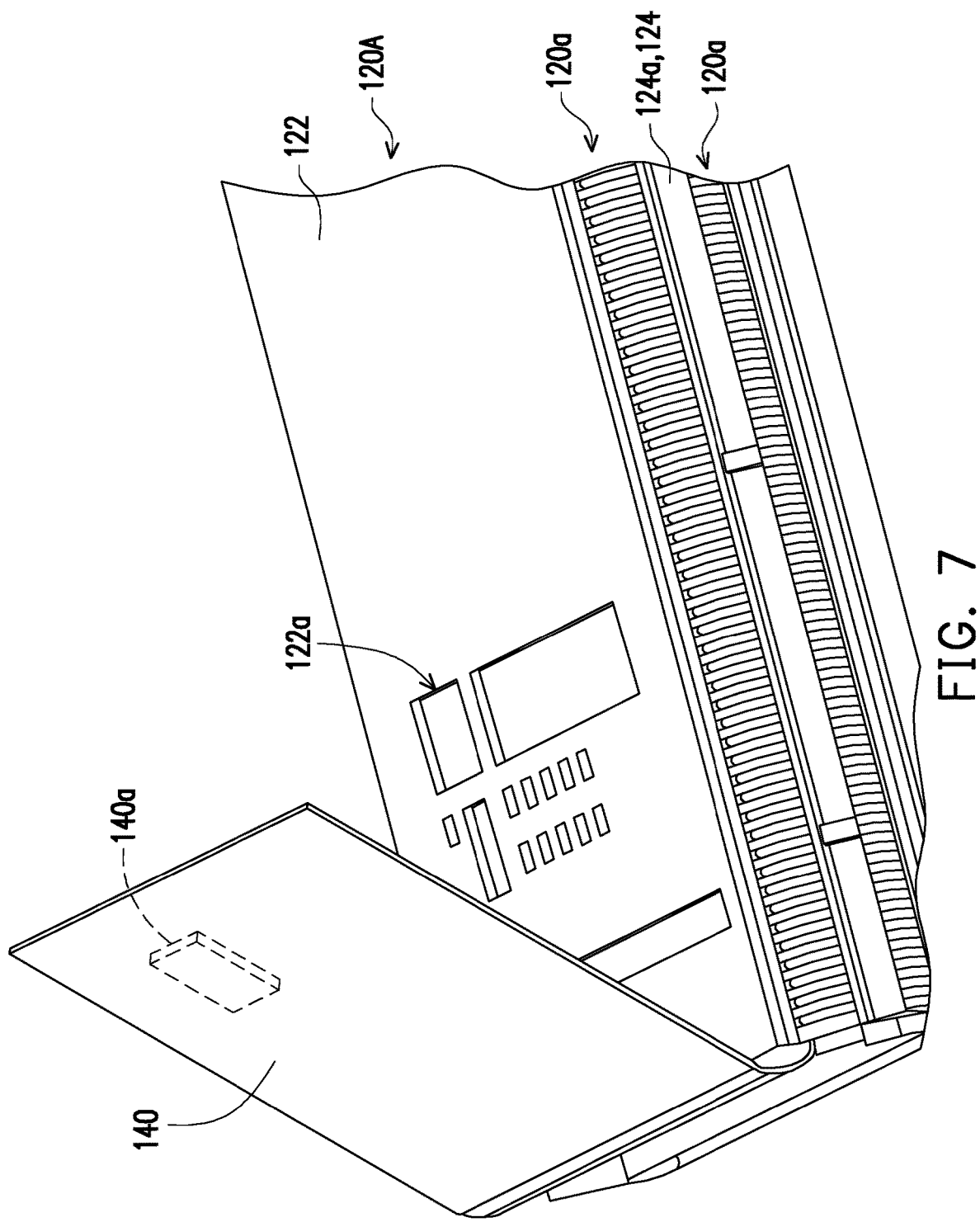
FIG. 7 illustrates a flexible circuit board of FIG. 6 being lifted off a supporting layer.

FIG. 6 is a perspective view of some components of a display according to another embodiment of the disclosure. FIG. 7 illustrates a flexible circuit board of FIG. 6 being lifted off a supporting layer. Please refer to FIG. 6 and FIG. 7. The difference between the embodiment shown in FIG. 6 and FIG. 7 and the foregoing embodiment is that the display in FIG. 6 and FIG. 7 further includes at least one flexible circuit board 140 (illustrated as two in FIG. 6). The flexible circuit board 140 is, for example, a control circuit board of the flexible display panel 130 and has at least one electronic element 140a (illustrated as one in FIG. 7) thereon. The electronic element 140a is, for example, a control chip or other types of electronic element on the flexible circuit board 140, which is not limited by the disclosure. The supporting layer 120A has at least one groove 122a at the extending section 122. The groove 122a and the flexible display panel 130 are respectively located on two opposite sides of the supporting layer 120A. The flexible circuit board 140 is connected to the flexible display panel 130 and is bent toward the groove 122a, so that the electronic element 140a may be accommodated in the groove 122a. Therefore, the thickness of the overall device can be reduced, and the effect of protecting the electronic element 140a can be achieved.

Figure 8:
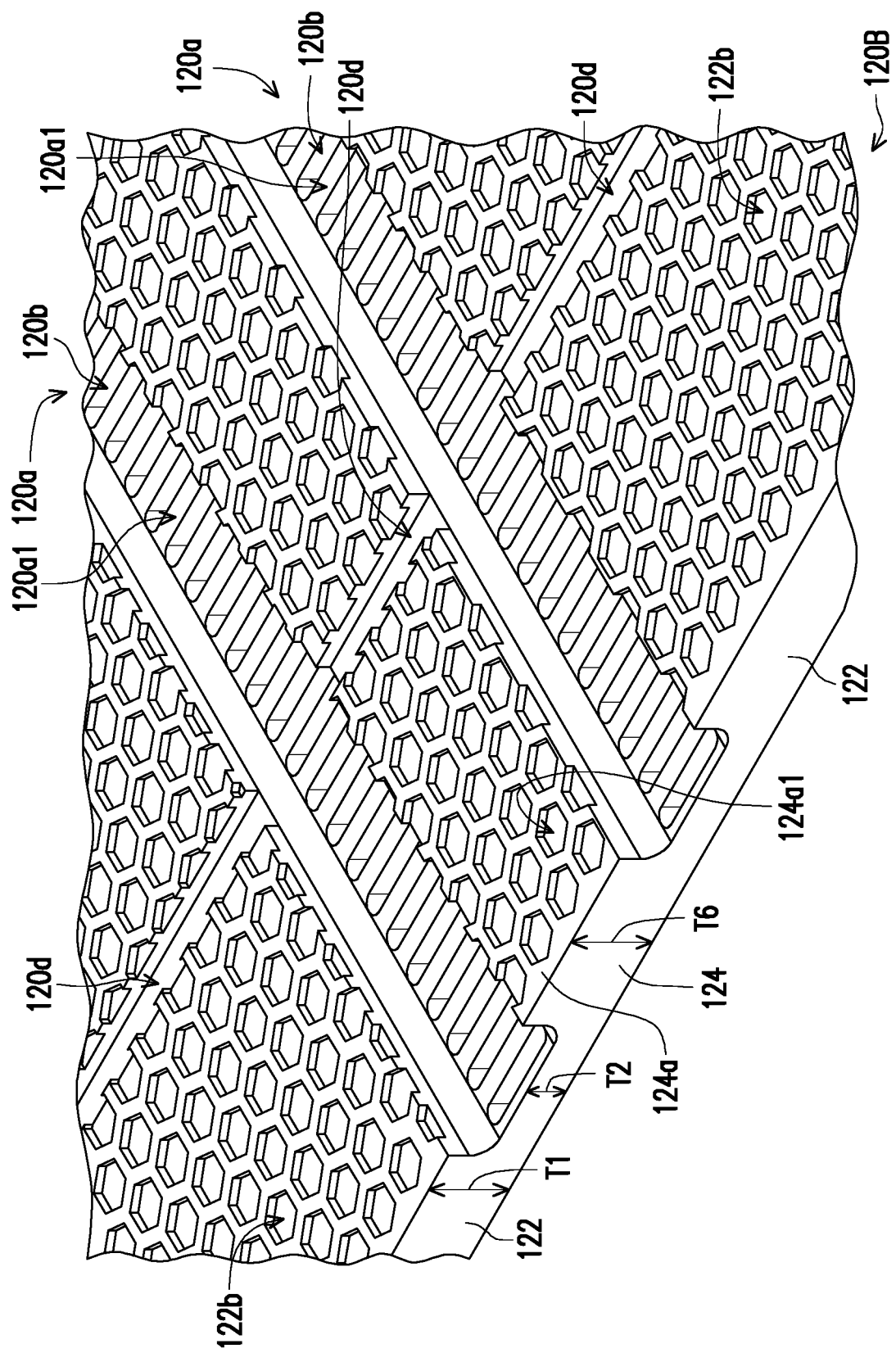
FIG. 8 is a perspective view of a supporting layer according to another embodiment of the disclosure.

FIG. 8 is a perspective view of a supporting layer according to another embodiment of the disclosure. The differences between the embodiment shown in FIG. 8 and the foregoing embodiment are that a part of the material of the top surface 124a1 of the supporting convex portion 124a may be removed as shown in FIG. 8 to form a concave-convex surface, and a part of the material of the surface 122b may be removed to form a concave-convex surface, thereby improving the flexibility of a supporting layer 120B. Such measure may also increase the heat dissipation area of the supporting layer 120B, thereby improving the heat dissipation efficiency of the overall device. In the embodiment, the processing depth of the concave-convex surface of the extending section 122 is, for example, less than the difference between the first thickness T1 and the second thickness T2, and the processing depth of the concave-convex surface of the supporting convex portion 124a is, for example, less than the difference between the sixth thickness T6 and the second thickness T2, but the disclosure is not limited thereto.

Figure 9:
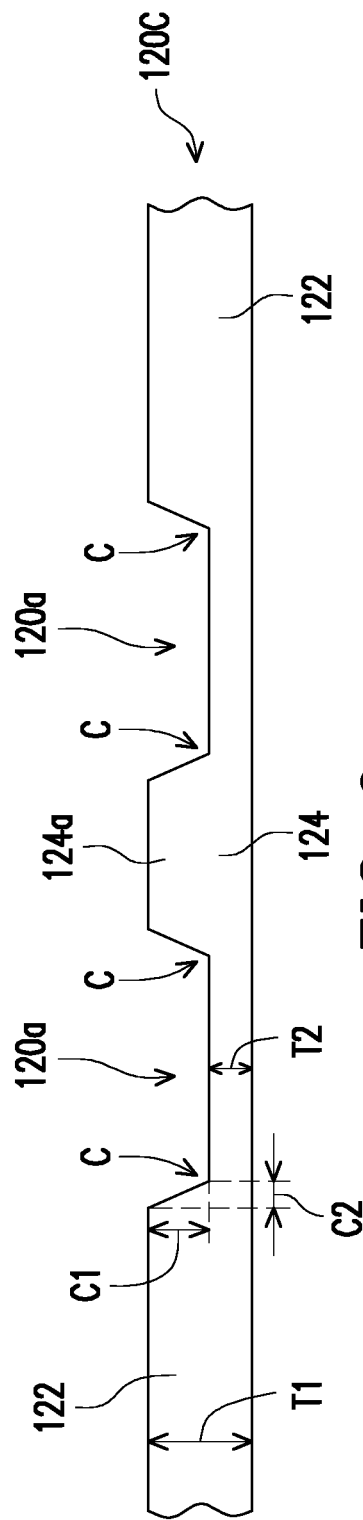
FIG. 9 is a partial schematic view of a supporting layer according to another embodiment of the disclosure.

FIG. 9 is a partial schematic view of a supporting layer according to another embodiment of the disclosure. The differences between the embodiment shown in FIG. 9 and the foregoing embodiment are that in a supporting layer 120C of FIG. 9, the junction between the groove 120a and the supporting convex portion 124a forms a chamfered corner C instead of the rounded corner R, and the junction between the groove 120a and the extending section 122 forms a chamfered corner C instead of the rounded corner R. In the embodiment, a depth C1 of the chamfered corner C is less than or equal to the difference between the thickness T1 and the thickness T2, a width C2 of the chamfered corner C is less than or equal to twice the thickness T1, and the depth C1 of the chamfered corner C is less than or equal to the width C2 of the chamfered corner C.

Figure 10:
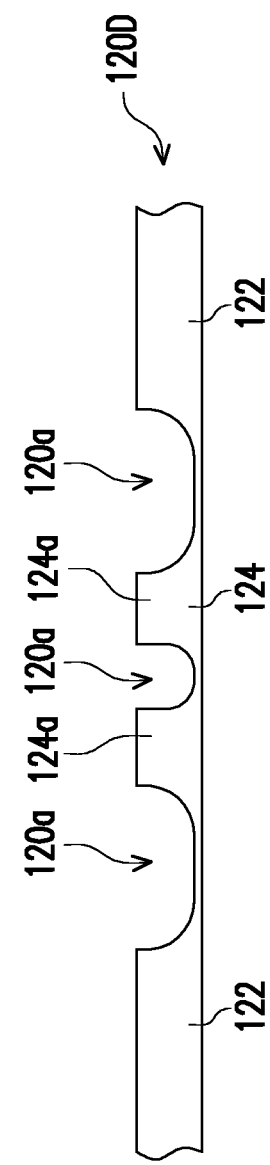
FIG. 10 is a partial schematic view of a supporting layer according to another embodiment of the disclosure.

FIG. 10 is a partial schematic view of a supporting layer according to another embodiment of the disclosure. The differences between the embodiment shown in FIG. 10 and the foregoing embodiment are that the number of the groove 120a is three and the number of the supporting convex portion 124a is two. In addition, the width of the groove 120a in the middle may be less than the widths of the grooves 120a on the two sides thereof as shown in FIG. 9, so as to appropriately maintain the structural strength of the central portion of the bending section 124 of a supporting layer 120D.

Figure 11:
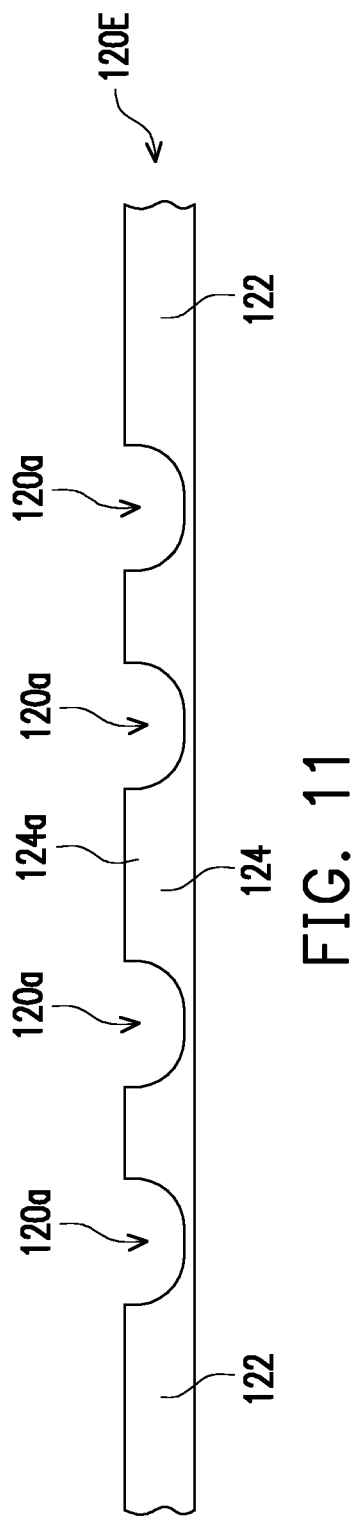
FIG. 11 is a partial schematic view of a supporting layer according to another embodiment of the disclosure.

FIG. 11 is a partial schematic view of a supporting layer according to another embodiment of the disclosure. The differences between the embodiment shown in FIG. 11 and the foregoing embodiment are that the number of the groove 120a is four and the number of the supporting convex portion 124a is three. In addition, the width of the supporting convex portion 124a in the middle may be greater than the widths of the supporting convex portions 124a on the two sides thereof as shown in FIG. 11, so as to appropriately maintain the structural strength of the central portion of the bending section 124 of a supporting layer 120E.

In summary, the supporting layer of the disclosure forms the groove at the bending section thereof to reduce the thickness of the supporting layer at the groove, and the extending direction of the groove is parallel to the bent axis of the bending section, so that the supporting layer may be easily bent. In the bending section, the portion where the groove is not formed (i.e. the supporting convex portion) may partially maintain the structural strength of the bending section to prevent the flexible display panel from recessing at the bending section due to insufficient overall structural strength of the bending section. In addition, the supporting layer of the disclosure further forms the indentation at the bottom surface of the groove, and the extending direction of the indentation is not parallel to the bent axis of the bending section to provide the effect similar to a structural reinforcement rib when bending the bending section, so that the supporting layer and the flexible display panel are less likely to be distorted and damaged due to bending. Moreover, as mentioned above, forming the indentation at the bottom surface of the groove achieves the effect of appropriately removing the material of the supporting layer to reduce the impurity content in the material of the supporting layer, thereby preventing the impurity from affecting the material property of the supporting layer and causing cracking after multiple times of bending. Furthermore, instead of defining the bending section by combining components of different materials, the supporting layer of the disclosure defines the bending section by forming the groove as mentioned above, so the supporting layer of the disclosure may be an integrally formed structure to facilitate the formation of the chamfered corner or the rounded corner at the step of the bending section, so as to prevent stress concentration at the step of the bending section, which increases the probability of structural damage. In addition, the chamfered corner or the rounded corner can reduce the step level between the bending section and the extending section, and also has the effect of preventing the flexible display panel from recessing at the bending section. On the other hand, the accommodating space formed between the bending section and the carrying main body of the supporting layer may accommodate particles such as dust that enter between the bending section and the carrying main body from the outside, so as to prevent the particles such as dust from closely leaning against the supporting layer and causing the flexible display panel to exhibit bumps.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display, comprising:
   a supporting layer, having at least two extending sections and at least one bending section, wherein the at least one bending section is connected between the at least two extending sections and is adapted to be bent along an axis as a rotation axis, the supporting layer has at least one groove at the at least one bending section and at least one indentation at a bottom surface of the at least one groove, an extending direction of the at least one groove is parallel to the axis, an extending direction of the at least one indentation is not parallel to the axis, the supporting layer has a first thickness at each of the at least two extending sections, the supporting layer has a second thickness at the at least one groove, the supporting layer has a third thickness at the at least one indentation, and the first thickness, the second thickness, and the third thickness are different from one another; and a flexible display panel, disposed on the supporting layer, wherein the at least one groove and the flexible display panel are respectively located on two opposite sides of the supporting layer.

2. The display according to claim 1, wherein the supporting layer has at least one supporting convex portion at the at least one bending section to define the at least one groove.

3. The display according to claim 2, comprising a carrying main body, wherein the supporting layer is carried on the carrying main body, and the at least one supporting convex portion is supported between the at least one bending section and the carrying main body to form an accommodating space between the at least one bending section and the carrying main body.

4. The display according to claim 2, comprising a carrying main body, wherein the supporting layer has at least one guiding groove on a top surface of the at least one supporting convex portion, an extending direction of the at least one guiding groove is perpendicular to the axis, and the supporting layer is adapted to slide relative to the carrying main body by guidance of the at least one guiding groove.

5. The display according to claim 2, wherein a top surface of the at least one supporting convex portion is a concave-convex surface.

6. The display according to claim 2, wherein a junction between the at least one groove and the at least one supporting convex portion forms a chamfered corner or a rounded corner.

7. The display according to claim 1, comprising a carrying main body, wherein the supporting layer has at least one guiding groove at at least one of the at least two extending sections, the at least one guiding groove and the flexible display panel are respectively located on two opposite sides of the supporting layer, an extending direction of the at least one guiding groove is perpendicular to the axis, and the supporting layer is adapted to slide relative to the carrying main body by guidance of the at least one guiding groove.

8. The display according to claim 1, comprising at least one flexible circuit board, wherein the at least one flexible circuit board has at least one electronic element thereon, the supporting layer has at least one groove at at least one of the at least two extending sections, the at least one groove and the flexible display panel are respectively located on two opposite sides of the supporting layer, the at least one flexible circuit board is connected to the flexible display panel and is bent toward the at least one groove, and the at least one electronic element is accommodated in the at least one groove.

9. The display according to claim 1, wherein a surface of at least one of the at least two extending sections is a concave-convex surface.

10. The display according to claim 1, wherein a junction between the at least one groove and the at least two extending sections forms a chamfered corner or a rounded corner.

* * * * *